United States Patent
Nishizawa et al.

(10) Patent No.: US 8,390,066 B2
(45) Date of Patent: Mar. 5, 2013

(54) SEMICONDUCTOR NANOWIRE MEMORY DEVICE

(75) Inventors: Hideyuki Nishizawa, Tokyo (JP); Satoshi Itoh, Ibaraki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 212 days.

(21) Appl. No.: 12/881,593

(22) Filed: Sep. 14, 2010

(65) Prior Publication Data

US 2011/0220876 A1   Sep. 15, 2011

(30) Foreign Application Priority Data

Mar. 15, 2010   (JP) .................................. 2010-057549

(51) Int. Cl.
  *H01L 27/11*   (2006.01)
  *H01L 27/12*   (2006.01)

(52) U.S. Cl. ............... 257/347; 257/E27.1; 257/E29.33; 257/E21.661; 257/E27.098

(58) Field of Classification Search ........ 257/4, E27.098, 257/347, E27.1, E29.33; 977/708, 720, 938
See application file for complete search history.

(56) References Cited

U.S. PATENT DOCUMENTS

| | | | |
|---|---|---|---|
| 6,798,000 B2 | 9/2004 | Luyken et al. | |
| 2006/0175601 A1* | 8/2006 | Lieber et al. ................... | 257/19 |
| 2006/0239062 A1* | 10/2006 | Liu et al. ....................... | 365/154 |
| 2007/0121371 A1* | 5/2007 | King ............................. | 365/154 |
| 2009/0146212 A1* | 6/2009 | Pei et al. ....................... | 257/350 |

FOREIGN PATENT DOCUMENTS

| | | |
|---|---|---|
| JP | 58-153295 | 9/1983 |
| JP | 3-278456 | 12/1991 |
| JP | 2003-69417 | 3/2003 |
| JP | 2003-69417 | * 7/2003 |
| JP | 2004-503097 | 1/2004 |
| JP | 2004-507104 | 3/2004 |
| JP | 2004-535066 | 11/2004 |
| WO | WO 02/17362 A2 | 2/2002 |
| WO | WO 03/005450 A2 | 1/2003 |

OTHER PUBLICATIONS

Office Aciton issued Jan. 31, 2012 in Japanese Patent Application No. 2010-057549 (with English translation).
Sung-Wook Chung, et al., "Silicon nanowire devices", Applied Physics Letters, vol. 76, No. 15, Apr. 10, 2000, pp. 2068-2070.
Sang-Kwon Lee, et al, "Si nanowire p-FET with asymmetric source-drain I-V characteristics", Solid State Communications, vol. 149, 2009, pp. 461-463.

* cited by examiner

*Primary Examiner* — Jerome Jackson, Jr.
*Assistant Examiner* — Paul Budd
(74) *Attorney, Agent, or Firm* — Oblon, Spivak, McClelland, Maier & Neustadt, L.L.P.

(57) ABSTRACT

According to an embodiment, a semiconductor memory device capable of stably operating even when an element is shrunk is provided. The semiconductor memory device of the embodiment includes: first and second diodes serially connected between power sources of two different potentials, formed by nanowires, and exhibiting negative differential resistances; and a select transistor connected between the first diode and the second diode. The nanowires are preferably silicon nanowires. The thickness of the silicon nanowires is preferably 8 nm or less.

8 Claims, 7 Drawing Sheets

AA CROSS SECTION

BB CROSS SECTION

CC CROSS SECTION

SEMICONDUCTOR NANOWIRE MEMORY DEVICE

CROSS-REFERENCE TO RELATED APPLICATION

This application is based upon and claims the benefit of priority from Japanese Patent Application No. 2010-057549, filed on Mar. 15, 2010, the entire contents of which are incorporated herein by reference.

FIELD

Embodiments described herein relate generally to a semiconductor memory device.

BACKGROUND

Generally, a memory cell in an SRAM (Static Random Access Memory) includes six elements (6 transistors, or four transistors and 2 resistors). A memory cell for an SRAM using tunneling diode devices has been proposed. This memory cell includes three elements that are two diodes and one transistor so as to be suitable to form memory cells in a high density.

The characteristic of a tunneling diode device highly depends on the characteristic of a tunneling barrier. Therefore, the fluctuation of the barrier size cause the fluctuation of the (tunneling) current which becomes several digits in a process of which a minimum feature size is 10 nm or less. As a result, the achievement of the memory cell becomes difficult in this size regime. In addition, a tunneling diode device that has a size equal to or smaller than a depletion layer width cannot be formed in principle. Therefore, it is quite difficult to form nano-meter order devices.

Conventionally, a transistor using silicon nanowires is proposed.

DETAILED DESCRIPTION

According to an embodiment, a semiconductor memory device capable of stably operating even when an element is shrunk or scaled-down is provided. The semiconductor memory device of the embodiment includes: first and second diodes serially connected between power sources of two different potentials, formed by nanowires, and exhibiting negative differential resistances; and a select transistor connected between the first diode and the second diode. The nanowires are preferably silicon nanowires. The thickness of the silicon nanowires is preferably 8 nm or less. Hereinafter, embodiments according to the invention will be described in detail referring to the accompanying drawings.

The inventors simulated current-voltage characteristic of a device in which a silicon nanowire is sandwiched by electrodes. As a result, the inventors found that a negative differential resistance occurs in the current-voltage characteristic. Embodiments to be provided below are based on the knowledge described above.

In the specification, "thickness" of a nanowire means a length of a portion where a height or a width is the largest in cross-sections of the nanowire. In addition, "nanowire" means a line-shaped semiconductor having a thickness of 10 nm or less.

First Embodiment

A semiconductor memory device of the embodiment includes: first and second diodes serially connected between power sources of two different potentials, formed by nanowires, and exhibiting negative differential resistances; and a select transistor connected between the first diode and the second diode. In the embodiment, a case where the nanowires are silicon nanowires will be exemplified.

Figure 1:
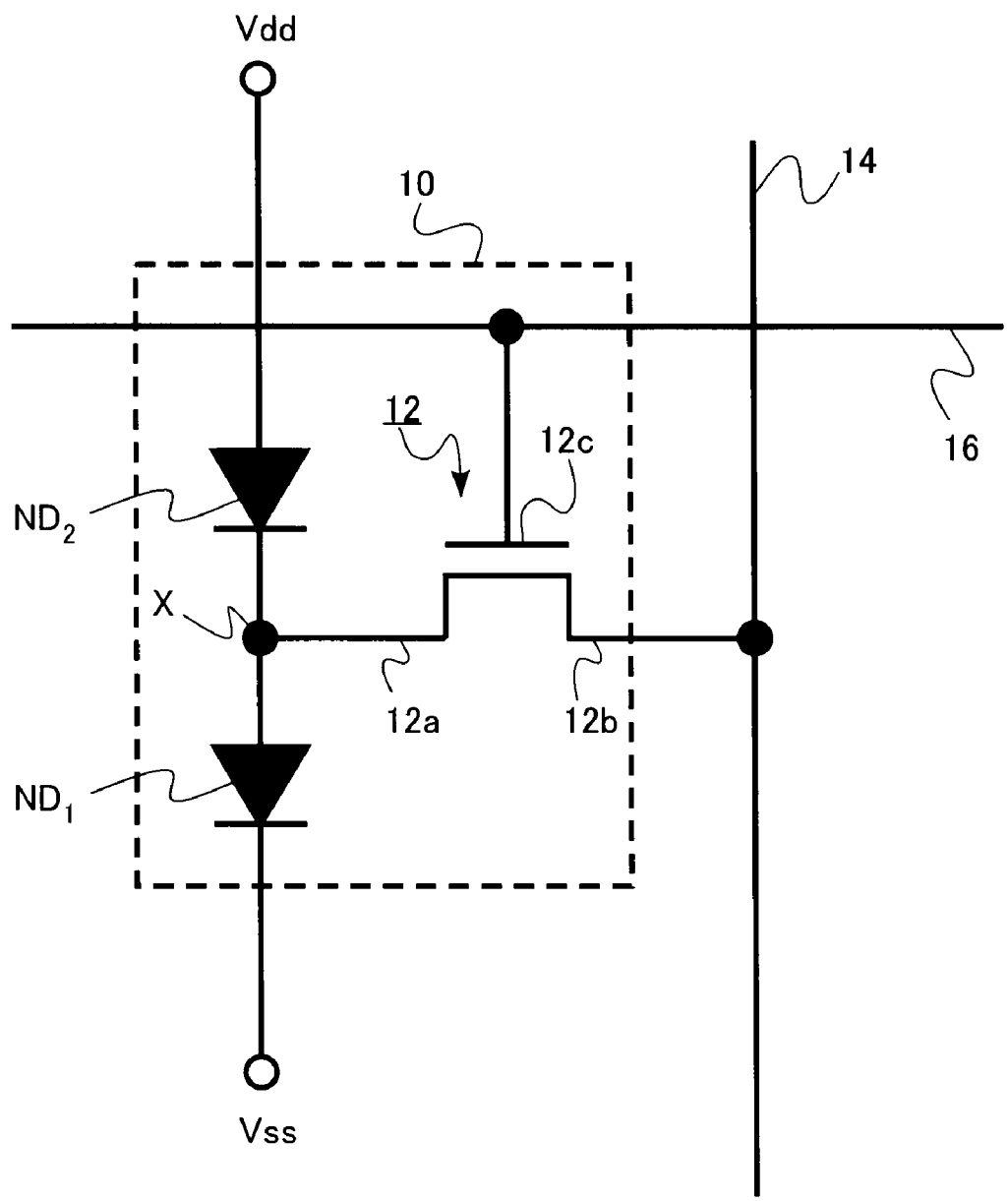
FIG. 1 is an equivalent circuit view of a semiconductor memory device according to a first embodiment.

FIG. 1 is an equivalent circuit view of a semiconductor memory device according to the embodiment. The semiconductor memory device of the embodiment is an SRAM.

A memory cell 10 of the SRAM of the embodiment includes three elements: a first diode $ND_1$; a second diode $ND_2$; and a select transistor 12. The first diode $ND_1$ and the second diode $ND_2$ are formed by silicon nanowires. The diodes are silicon nanowire diodes exhibiting negative differential resistances. The first diode $ND_1$ and the second diode $ND_2$ are diodes having matched characteristics having equivalent function.

The first diode $ND_1$ and the second diode $ND_2$ are serially connected between power sources of two different potentials, which are Vdd and Vss. Vss has a lower potential than Vdd in the embodiment. To a connect point X between the first diode $ND_1$ and the second diode $ND_2$, a drain electrode 12a of the select transistor 12 is connected.

A source electrode 12b of the select transistor 12 is connected to a data line 14 and a gate electrode 12c is connected to an address line 16. In FIG. 1, only one memory cell 10 is shown, but actually, an SRAM is configured by arranging a plurality of memory cells 10 in an array.

Figure 2:
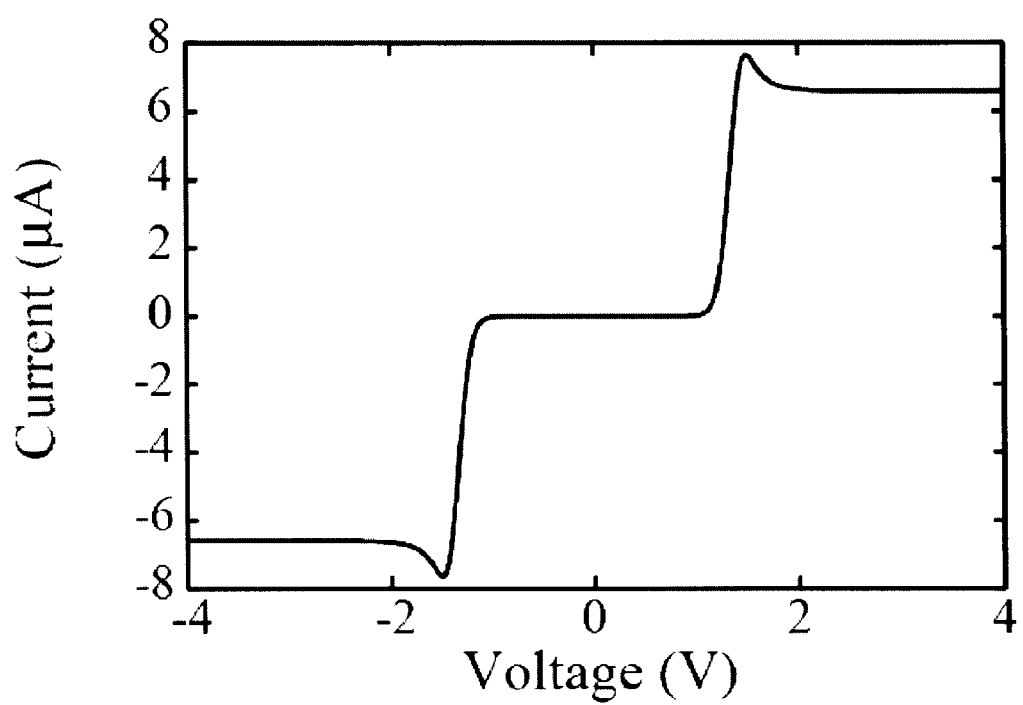
FIG. 2 is a view showing current-voltage characteristic of a silicon nanowire diode.

FIG. 2 is a view showing current-voltage characteristic of a silicon nanowire diode. FIG. 2 shows a result calculated through a simulation of current-voltage characteristic of a device in which a silicon nanowire is sandwiched by electrodes. In the simulation, calculation is performed with a model considering phonon effect (lattice vibration effect). The silicon nanowires having columnar shape are used. A diameter (thickness) of the shape is 3 nm and a length of the shape is 10 nm. The silicon nanowires are of intrinsic silicon that contains little impurities.

The lateral axis shows the voltage applied between the electrodes, and the vertical axis shows the current flowing into the device. It can be seen that a negative differential resistance that causes the current to decrease as the voltage increases occurs in the current-voltage characteristic.

Figure 3:
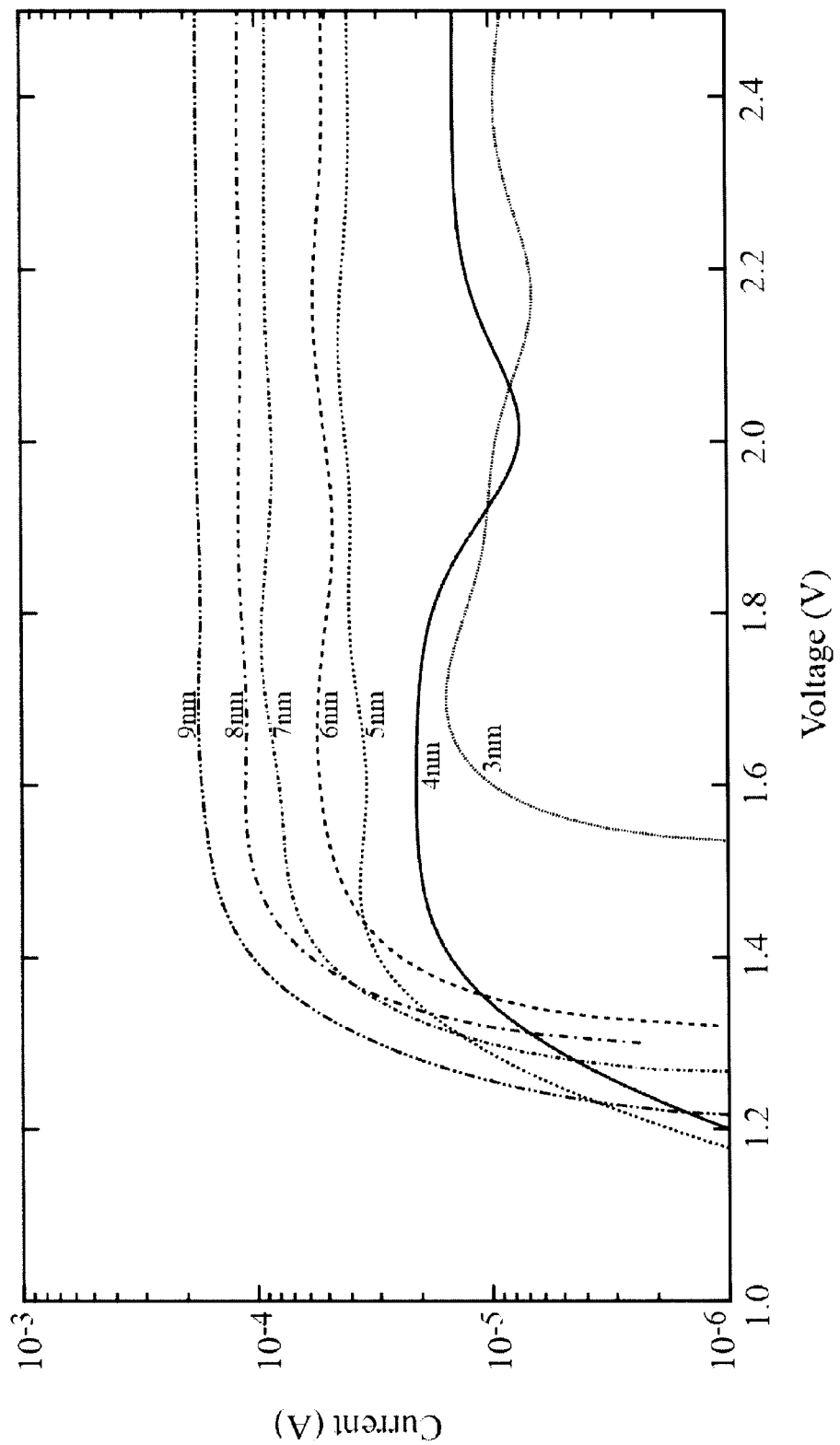
FIG. 3 is a view showing silicon nanowire thickness dependence of the current-voltage characteristic of a silicon nanowire diode.

FIG. 3 is a view showing silicon nanowire diameter dependence of the current-voltage characteristic of a silicon nanowire diode. As is clear from FIG. 3, under the simulation conditions, negative differential resistance is hardly exhibited when the diameter (thickness) of the silicon nanowire is more than 8 nm and significantly exhibited when the diameter is 4 nm or less. Therefore, the thickness of the silicon nanowire is preferably 8 nm or less, and more preferably 4 nm or less.

It is considered that such negative differential resistance of a silicon nanowire diode is exhibited by phonon effect inherent to nanowires. When the wire becomes the size of nanometer, the lattice vibration energy (phonon energy) is quantized and becomes large. In the case of the energy difference between the carrier in wire and Fermi potential of electrode approaches to this phonon energy, the resonance of the carrier exchange between the channel and the electrode and of the carrier scattering by this phonon (quantized lattice vibration) occur. The current increases, because the carrier exchange rate of the wire and the electrode become large by this resonance. However, when the applied voltage increases so that the difference between the energy level of the carriers and the Fermi level of the electrode increases beyond the quantized energy, the current decreases.

Which means that the characteristic of the silicon nanowire diode is not caused by the tunneling effect of a tunneling device or the like. Therefore, it is considered that the characteristic is comparably stable against the process fluctuation such as fabrication fluctuation, impurity distribution fluctuation, and impurity concentration fluctuation.

Figure 4:
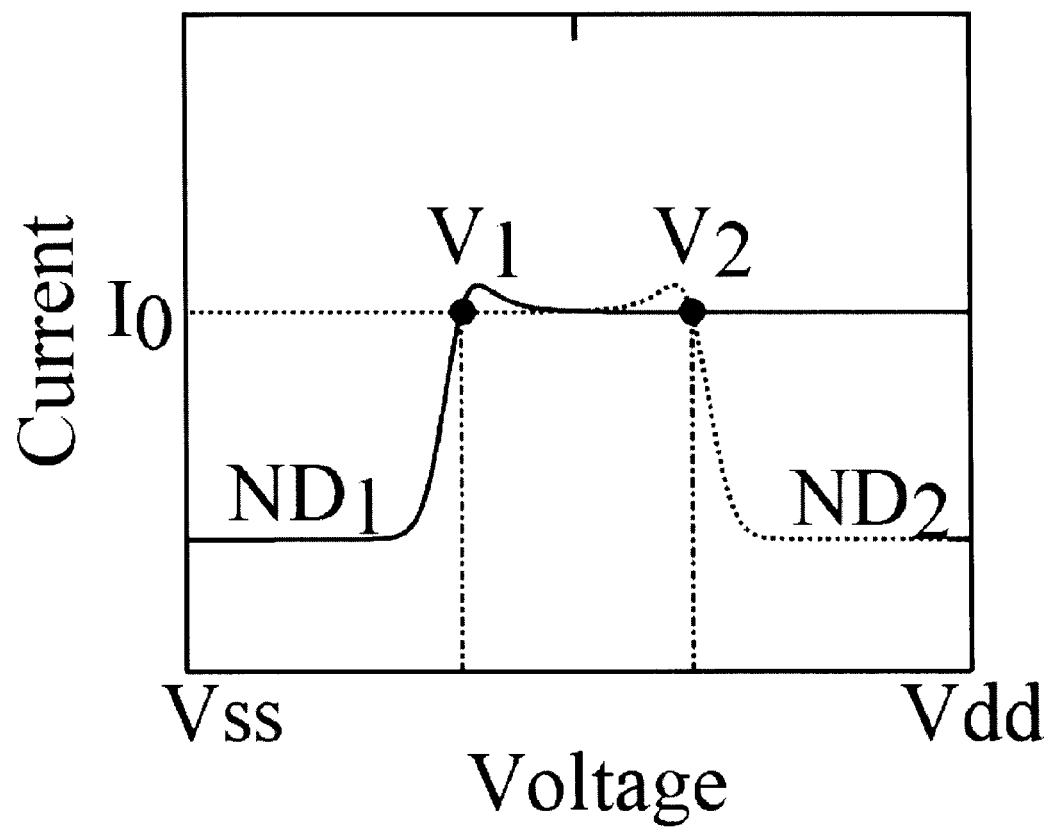
FIG. 4 is an explanatory view of memory cell operation of the first embodiment.

FIG. 4 is an explanatory view of memory cell operation of the embodiment. The lateral axis of FIG. 4 shows the potential of the connect point X between the first diode $ND_1$ and the second diode $ND_2$ of FIG. 1 and the vertical axis shows the current flowing into the first diode $ND_1$ and the second diode $ND_2$. The current flowing into the first diode $ND_1$ is shown by a solid line and the current flowing into the second diode $ND_2$ is shown by a dashed line.

The memory cell becomes in a stable state at two potentials $V_1$ and $V_2$ of the connect point X both causing the same current $I_0$ to flow from the current storage side at the connect point X. The memory cell 10 operates by defining one of the two stable potentials to be "1" and the other is defined to be "0".

Upon write operation, a potential is applied to the address line 16 connected to the gate electrode 12c of the select transistor 12 to turn on the select transistor 12, thereby applying the voltage $V_1$ or $V_2$ to the data line 14. Accordingly, the potential between the source electrode 12b and the drain electrode 12a of the select transistor 12 connected to the data line 14 becomes zero and the potential of the connect point X becomes the applied potential $V_1$ or $V_2$. This state is maintained even when the select transistor 12 is turned off since the potential written into the memory cell 10 is in the stable state.

Upon read operation, a potential is applied to the address line 16 connected to the gate electrode 12c of the select transistor 12 to turn on the select transistor 12. Then, the potential $V_1$ or $V_2$ stored at the connect point X is output to the data line 14 connected to the source electrode 12b so that the potential written into the memory cell 10 can be read.

In this way, the memory cell 10 operates as a memory cell of an SRAM.

In the semiconductor memory device of the embodiment, the characteristic of the silicon nanowire diode mainly depends on the thickness of the silicon nanowires. Accordingly, if control of the thickness of the silicon nanowires is particularly kept, the characteristic can be significantly stable against other process fluctuation such as fabrication fluctuation, impurity concentration fluctuation, or impurity distribution fluctuation. Therefore, it is possible to provide a semiconductor memory device capable of stably operating even when an element is shrank or scaled-down. This means that it is possible to provide a semiconductor memory device capable of stably operating with high memory capacity.

Figure 5:
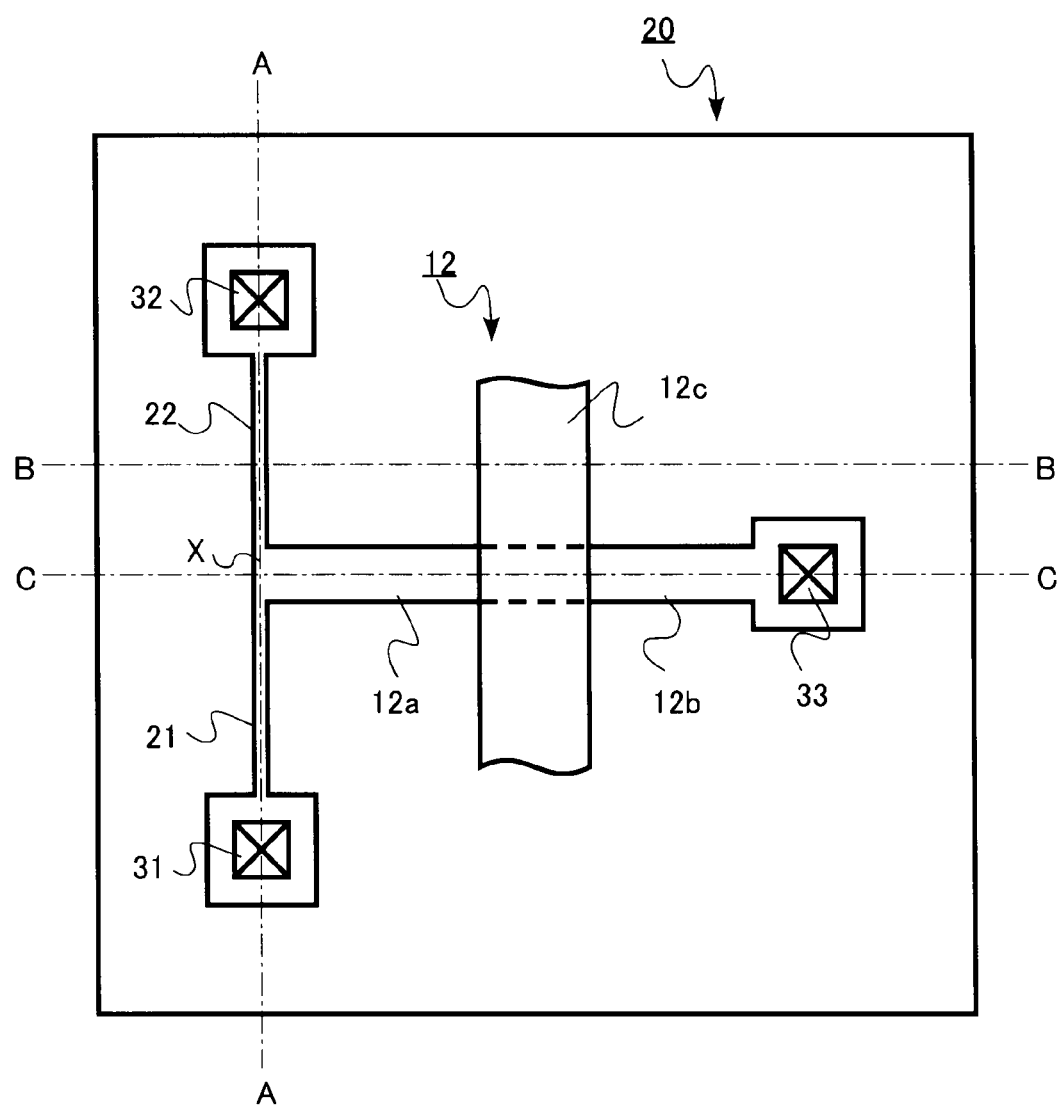
FIG. 5 is a schematic top view of the semiconductor memory device according to the first embodiment.
Figure 6:
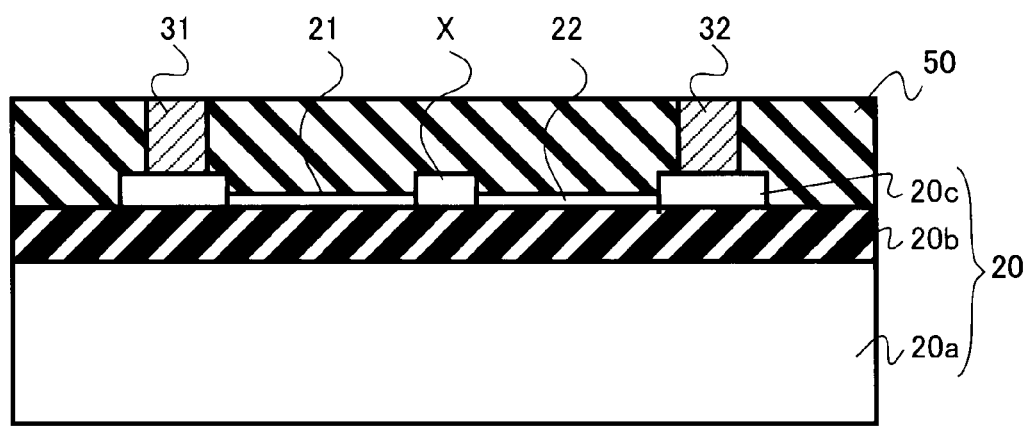
FIG. 6 is a section view taken along line A-A of FIG. 5.
Figure 7:
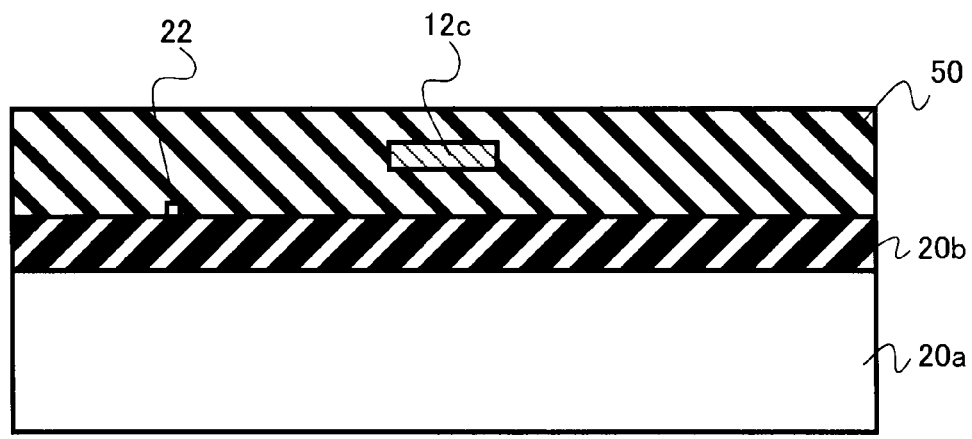
FIG. 7 is a section view taken along line B-B of FIG. 5.
Figure 8:
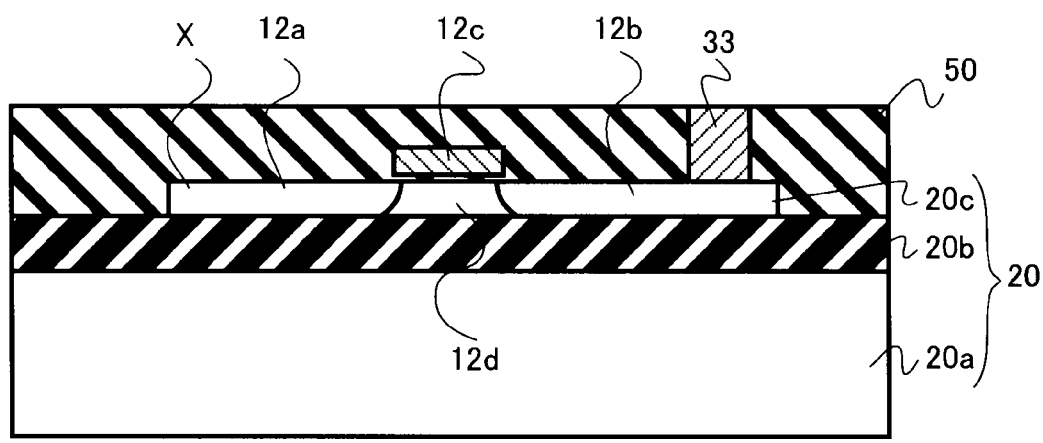
FIG. 8 is a section view taken along line C-C of FIG. 5.

FIG. 5 is a schematic top view of the semiconductor memory device according to the embodiment. FIGS. 6 to 8 are respectively a section view taken along line A-A, a section view taken along line B-B, and a section view taken along line C-C of FIG. 5.

The semiconductor device of the embodiment is formed on an SOI (Silicon On Insulator) substrate 20. The SOI substrate includes: a silicon substrate 20a; an insulating layer 20b; and SOI layers 20c.

A silicon nanowire 21 of the first diode $ND_1$ and a silicon nanowire 22 of the second first diode $ND_2$ are both formed by the SOI layers 20c. The silicon nanowires 21 and 22 are non-doped intrinsic silicon or single conductivity type, which is n-type or p-type, silicon.

The width and height of the silicon nanowires 21 and 22 are 4 μm or less, for example. On the silicon nanowires 21 and 22, an interlayer film 50 is formed.

On the SOI layer 20c on one end of the silicon nanowire 21, a Vss contact electrode 31 is formed. On the other end of the silicon nanowire 21, the silicon nanowire 22 is formed through the SOI layer 20c serving as the connect point X. On the SOI layer 20c on a side of the silicon nanowire 22 opposite to the connect point X, a Vdd contact electrode 32 is formed.

The SOI layers 20c under the Vss contact electrode 31 and the Vdd contact electrode 32 may be doped with n-type or p-type impurities in order to decrease contact resistance. When the silicon nanowires 21 and 22 are doped, the silicon nanowires and the SOI layers 20c under the contact electrode are of the same conductivity type in order not to form p-n junction therebetween.

The drain electrode 12a, the source electrode 12b, and a channel region 12d of the select transistor 12 are formed in the SOI layer 20c. The drain electrode 12a and the source electrode 12b are formed by n-type impurity diffusion layers, for example. On the channel region 12d, the gate electrode 12c is formed on a gate insulating film. On the SOI layer 20c on the source electrode 12b side, a data line contact electrode 33 is formed.

The semiconductor memory device shown in FIGS. 5 to 8 can be formed by a process common with a select transistor of a planar MIS transistor by forming the silicon nanowires by the SOI layers. Therefore, a semiconductor memory device capable of stably operating even when an element is shrank or scaled-down can be realized through a process which can be well matched with processes of other elements and which is simple.

The thickness (or width) of the silicon nanowires is controlled by masking regions other than the silicon nanowires after the SOI layers 20c are patterned, for example, and then performing isotropic etching and oxidation of silicon, for example. In this way, SOI layers right after the patterning can be thinned and fined more so as to decrease the thickness and the width, whereby silicon nanowires having a desired thickness (or width) can be realized.

Second Embodiment

A semiconductor memory device of the embodiment is the same as that of the first embodiment except that nanowires are germanium nanowires instead of the silicon nanowires. Therefore, the contents overlapping with the first embodiment will not be repeated.

A germanium nanowire is a semiconductor of Group IV similarly to silicon and the crystal structure thereof is diamond structure also similarly to silicon. Accordingly, a germanium nanowire is considered to exhibit negative differential resistance due to phonon effect similarly to a silicon nanowire. Therefore, an effect similarly to the first embodiment can be expected using germanium nanowires.

While certain embodiments have been described, these embodiments have been presented by way of example only, and are not intended to limit the scope of the inventions. Indeed, the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, in the first embodiment, a case where the silicon nanowires are formed by the SOI layers is exemplified, but a memory cell may be structured by forming electrodes on silicon nanowires grown by vapor using CVD method or the like, for example.

For example, in the embodiments, a case where the select transistor is formed by a planar MIS transistor is exemplified, but the select transistor may be a nanowire transistor using a nanowire.

For example, in the embodiments, a case where the nanowire diodes are formed by lateral devices is exemplified, but the nanowire diodes may be formed by a vertical devices.

What is claimed is:

1. A semiconductor memory device comprising:
    first and second diodes serially connected between power sources of two different potentials, the diodes being formed by non-doped silicon nanowires or non-doped germanium nanowires, the diodes having a thickness of 10 nm or less, and exhibiting negative differential resistances; and
    a select transistor connected between the first diode and the second diode.

2. The device according to claim 1, wherein the nanowires are silicon nanowires.

3. The device according to claim 2, wherein a thickness of the silicon nanowires is 8 nm or less.

4. The device according to claim 2, wherein the silicon nanowires are formed in an SOI layer of an SOI substrate.

5. A semiconductor memory device comprising:
    first and second diodes serially connected between power sources of two different potentials, the diodes being formed by non-doped silicon nanowires or non-doped germanium nanowires, the diodes having a thickness of 10 nm or less, and exhibiting negative differential resistances;
    a select transistor, a drain electrode of the select transistor being connected between the first diode and the second diode;
    a data line being connected to a source electrode of the select transistor; and
    an address line being connected to a gate electrode of the select transistor.

6. The device according to claim 5, wherein the nanowires are silicon nanowires.

7. The device according to claim 6, wherein a thickness of the silicon nanowires is 8 nm or less.

8. The device according to claim 6, wherein the silicon nanowires are formed in an SOI layer of an SOI substrate.

* * * * *